(12) United States Patent
Vasiliev

(10) Patent No.: US 7,360,147 B2
(45) Date of Patent: Apr. 15, 2008

(54) SECOND STAGE SOVA DETECTOR

(75) Inventor: Peter Igorevich Vasiliev, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 496 days.

(21) Appl. No.: 11/131,797

(22) Filed: May 18, 2005

(65) Prior Publication Data

US 2006/0282753 A1 Dec. 14, 2006

(51) Int. Cl.
*H03M 13/03* (2006.01)
(52) U.S. Cl. .................. 714/794; 714/796; 714/795; 704/242; 375/262
(58) Field of Classification Search .......... 714/794, 714/796; 704/242; 375/262
See application file for complete search history.

(56) References Cited

U.S. PATENT DOCUMENTS

| | | | |
|---|---|---|---|
| 5,659,580 A | 8/1997 | Partyka | 375/295 |
| 5,721,745 A | 2/1998 | Hladik et al. | 371/43 |
| 5,825,832 A * | 10/1998 | Benedetto | 375/341 |
| 5,881,308 A | 3/1999 | Dwyer, III | 39/800.23 |
| 5,983,385 A | 11/1999 | Khayrallah et al. | 714/755 |
| 6,023,783 A | 2/2000 | Divsalar et al. | 714/792 |
| 6,035,427 A | 3/2000 | Kweon | 714/702 |
| 6,178,530 B1 | 1/2001 | Aman et al. | 714/702 |
| 6,192,503 B1 | 2/2001 | Chennakeshu et al. | 714/796 |
| 6,289,486 B1 | 9/2001 | Lee et al. | 714/788 |
| 6,304,985 B1 | 10/2001 | Sindhushayana et al. | 714/702 |
| 6,353,900 B1 | 3/2002 | Sindhushayana et al. | 714/701 |
| 6,445,755 B1 * | 9/2002 | Chung et al. | 375/341 |
| 6,581,182 B1 * | 6/2003 | Lee | 714/795 |
| 6,668,026 B1 * | 12/2003 | Miyauchi | 375/341 |
| 6,675,348 B1 | 1/2004 | Hammons, Jr. et al. | 714/790 |
| 6,708,308 B2 * | 3/2004 | De Souza et al. | 714/795 |
| 6,760,390 B1 * | 7/2004 | Desai et al. | 375/341 |
| 6,802,037 B2 * | 10/2004 | Kim et al. | 714/755 |
| 6,845,482 B2 | 1/2005 | Yao et al. | 714/755 |
| 7,010,051 B2 * | 3/2006 | Murayama et al. | 375/262 |

(Continued)

FOREIGN PATENT DOCUMENTS

JP 2000441140 A * 12/2000

(Continued)

OTHER PUBLICATIONS

Chen et. al., Dual-Mode Convolutional/SOVA Based Turbo Code Decoder VLSI Design for Wireless Communication Systems, 2003, IEEE, pp. 369-372.*

(Continued)

*Primary Examiner*—Mujtaba K. Chaudry
(74) *Attorney, Agent, or Firm*—Westman, Champlin & Kelly, P.A.

(57) ABSTRACT

A second stage SOVA detector comprises a dynamic state reordering block with inputs that receive absolute state domain data from a first stage SOVA detector. The second stage SOVA detector provides relative state domain data outputs and selection bit outputs. The second stage SOVA detector comprises pipeline registers. The pipeline registers receive the relative state domain data outputs and the selection bit outputs and provide pipelined outputs. The second stage SOVA detector comprises a reliability update-register exchange unit receiving the pipelined outputs and providing detected data bits and reliabilities.

20 Claims, 5 Drawing Sheets

U.S. PATENT DOCUMENTS

| | | | |
|---|---|---|---|
| 7,050,419 B2* | 5/2006 | Azenkot et al. | 370/347 |
| 7,051,270 B2* | 5/2006 | Miyauchi et al. | 714/794 |
| 7,191,377 B2* | 3/2007 | Berens et al. | 714/755 |
| 2002/0021516 A1 | 2/2002 | Burns et al. | 360/46 |
| 2002/0046371 A1 | 4/2002 | Halter | 714/702 |
| 2002/0154430 A1 | 10/2002 | Rae et al. | 360/25 |
| 2002/0154620 A1 | 10/2002 | Azenkot et al. | 370/347 |
| 2002/0168033 A1 | 11/2002 | Suzuki et al. | 375/341 |
| 2003/0058954 A1 | 3/2003 | He | 375/262 |
| 2003/0076873 A1 | 4/2003 | Wengerter et al. | 375/141 |
| 2003/0097621 A1 | 5/2003 | Xin | 714/701 |
| 2003/0126551 A1 | 7/2003 | Mantha et al. | 714/790 |
| 2003/0193966 A1 | 10/2003 | Mills | 370/476 |
| 2004/0010742 A1 | 1/2004 | Williamson et al. | 714/746 |
| 2004/0255217 A1 | 12/2004 | Garrett et al. | 714/746 |
| 2004/0264561 A1 | 12/2004 | Alexander et al. | 375/232 |
| 2005/0022090 A1* | 1/2005 | Cameron et al. | 714/755 |
| 2005/0034046 A1 | 2/2005 | Berkmann et al. | 714/755 |
| 2006/0107176 A1* | 5/2006 | Song | 714/758 |

FOREIGN PATENT DOCUMENTS

JP    2004215310 A   *   7/2004

OTHER PUBLICATIONS

Augsburger et.al., 500 Mb/s Soft Output Viterbi Decoder, 2002, ESSCIRC, pp. 523-526.*

Lee et al., A Code-Aided Adaptive Equalizer Using Soft Decision-Directed Algorithm and Convolutional Coding for Fading Channels, 2001, IEEE, pp. 1664-1667.*

Claude Berrou, Patrick Adde, Ettiboua Angui and Stephane Faudeil, "A Low Complexity Soft-Output Viterbi Decoder Architecture," Proc. Of ICC 1993, pp. 737-740.

C. Berrou, A. Glavieux, and P. Thitmajshima, "Near Shannon limit error-correction coding and decoding: Turbo-codes," in Proc IEEE ICC 1993, pp. 1064-1070.

J. Hagenauer, E. Offer, and L. Papke, "Interative decoding of binary block and convolutional codes," IEEE Trans. Info. Theory, vol. 42, pp. 429-445, Mar. 1996.

R. Pyndiah, "Near-optimum decoding of product codes: block turbo codes," IEEE Trans. Commun., vol. 46, No. 8, pp. 1003-1010, Aug. 1998.

J. Hagenauer and P. Hoeher, "A Viterbi algorithm with soft-decision outputs and its applications," in Proc. IEEE Globecom '89, (Dallas, TX, Nov. 1989), pp. 1680-1686.

L.R. Bahl, J. Cocke, F. Jelinek, and J. Raviv, "Optimal decoding of linear codes for minimizing symbol error rate," IEEE Trans. Inform. Theory, vol. IT-20, pp. 284-287, Mar. 1974.

Ramesh Pyndiah, Alain Glavieux, Annie Picart and Sylvie Jacq, "Near Optimum Decoding of Product Codes," IEEE, 1994, pp. 339-343.

Engling, Yoo, Payam Pakzad, Borivoje Nikolic, Venkat Anatharam, "VLSI Architectures for Interactive Decoders in Magnetic Recording Channels," IEEE Transactions on Magnetics, vol. 37, No. 2, Mar. 2001.

U.S. Appl. No. 11/132,414, filed May 18, 2005, entitled "Iterative Detector With ECC in Channel Domain".

U.S. Appl. No. 11/131,518, filed May 18, 2005, entitled "Low Complexity Pseudo-Random Interleaver".

* cited by examiner

SECOND STAGE SOVA DETECTOR

CROSS-REFERENCE TO RELATED APPLICATIONS

Cross-reference is hereby made to U.S. application Ser. No. 11/131,518, filed May 18, 2005 entitled "Low Complexity Pseudo-Random Interleaver" and to U.S. application Ser. No. 11/132,414, filed May 18, 2005 entitled "Iterative Detector with ECC in Channel Domain", which were filed on even date herewith.

FIELD OF THE INVENTION

The present invention relates generally to communication channels, and more particularly but not by limitation to read/write channels in data storage devices.

BACKGROUND OF THE INVENTION

Data communication channels generally include encoding of data before it passes through a communication medium, and decoding of data after it has passed through a communication medium. Data encoding and decoding are used, for example, in data storage devices for encoding data that is written on a storage medium and decoding data that is read from a storage medium. Encoding is applied in order to convert the data into a form that is compatible with the characteristics of communication medium, and can include processes such as channel detection, adding error correction codes, interleaving, turbo encoding, bandwidth limiting, amplification and many other known encoding processes. Decoding processes are generally inverse functions of the encoding processes. Encoding and decoding increases the reliability of the reproduced data.

Turbo decoding using a soft output viterbi algorithm (SOVA) is known. SOVA detectors can include one or two decoding stages and help to optimize the cost of implementation. Single stage SOVA detectors provide low latency at the cost of significantly larger areas of silicon. Dual stage SOVA detectors reduce the area of silicon, but at a cost of increased latency. In the second stage of a two stage SOVA detector, known solutions include large numbers of exclusive OR gates (XORs) or multiplexors. The large numbers of gates or multiplexors uses a large area of silicon and introduces significant delay. There is a desire to reduce the area of silicon used and to reduce the delay due to the large number of XORs or multiplexors in a second stage SOVA detector.

Embodiments of the present invention provide solutions to these and other problems, and offer other advantages over the prior art.

SUMMARY OF THE INVENTION

Disclosed is a second stage SOVA detector. The second stage SOVA detector comprises a dynamic state reordering block. The dynamic state reordering block has inputs that are couplable to receive absolute state domain data from a first stage SOVA detector. The second stage SOVA detector provides relative state domain data outputs and selection bit outputs.

The second stage SOVA detector comprises pipeline registers. The pipeline registers receive the relative state domain data outputs and the selection bit outputs and provide pipelined outputs.

The second stage SOVA detector comprises a reliability update-register exchange unit receiving the pipelined outputs and providing detected data bits and reliabilities.

In a preferred embodiment, the detected data bits and the reliabilities form a signed numerical value, and the sign represents the data and the numerical value represents the reliability.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
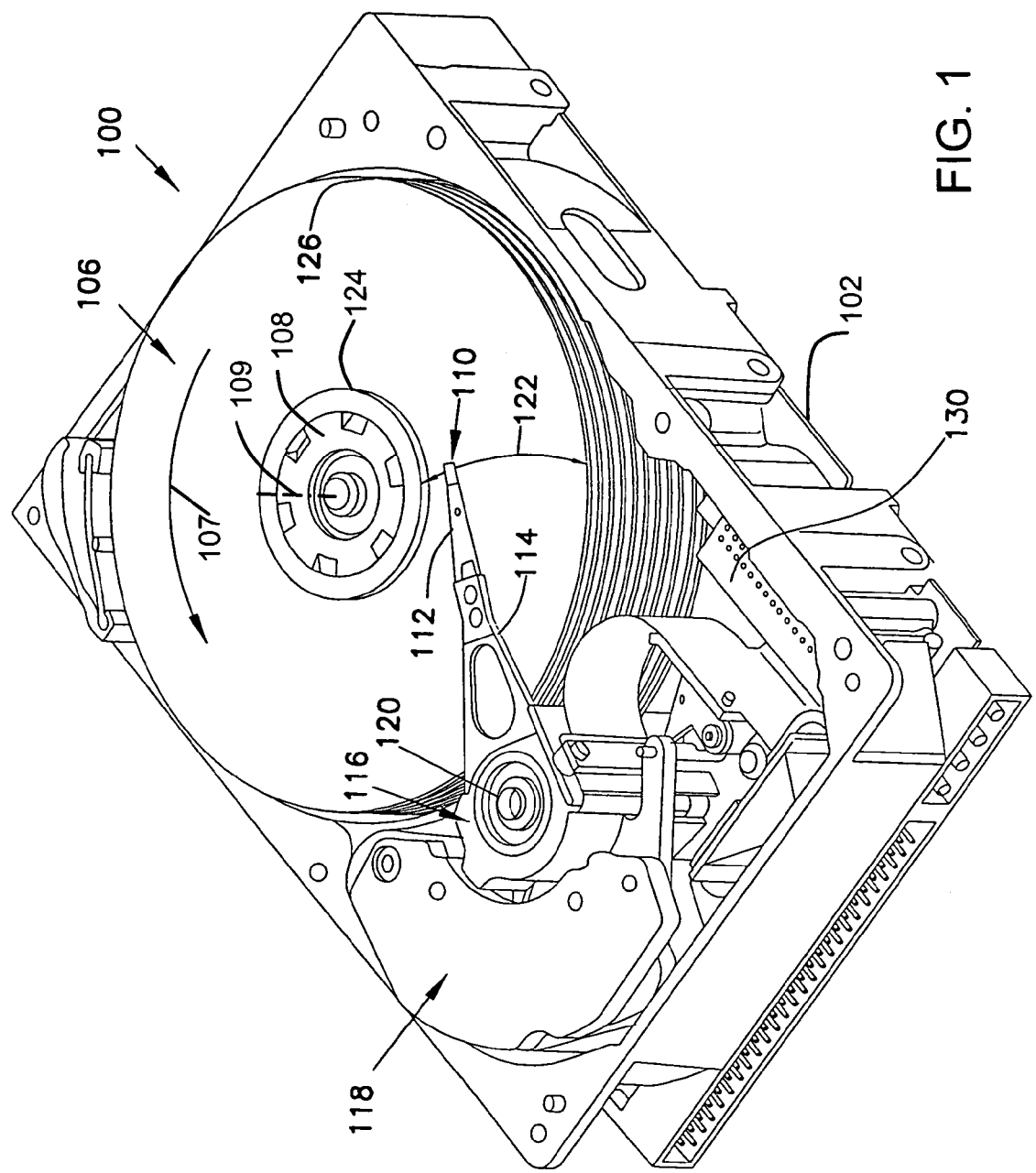
FIG. 1 is an isometric view of a disc drive.

Throughout the detailed description, acronyms are used that are defined in Table 1, unless the context indicates otherwise:

TABLE 1

| | |
|---|---|
| AMLPS | Current state of the Maximum Likelihood Path in the absolute state domain |
| AMLCS | Current state of the Competitor to the Maximum Likelihood Path in the absolute state domain |
| BD | branch decision |
| DSRB, DSR1, DSR2 . . . | dynamic state reordering block |
| ECC | error correction code |
| LLR | log likelihood ratio |
| MLC | maximum likelihood path competitor |
| MLCD | bitwise difference between the Maximum Likelihood Path and the MLC |
| MLCS | Current state of the MLC |
| MLP | maximum likelihood path |
| MLPMD | difference of the path metrics of the MLP and MLC |
| MLPMDSEL | subblock selecting MLPMD based on AMLPS from the PMD's coming from the first stage |
| MLPS | Current state of the MLP |
| MLST | subblock generating the AMLPS based on the MLP bits coming from the first stage. This subblock also generates a Selection Correction Bit (SCB) necessary for the generation of the Selection Bits SB1 . . . SB(S-1) because of the pipelining. |
| PDB | Precoded Data Bit Values |
| PMLP | Precoded MLP bits |
| PMD | path metric differences |
| PR, PR1, PR2, . . . | path registers |
| REG | pipeline register |
| RMLPS | relative state domain Maximum Likelihood Path State |
| RMLCS | relative state domain current Maximum Likelihood Path Competitor State |
| RST0, 1, 2, . . . | relative state reordering blocks |
| RUU | reliability update unit |
| RXU | register exchange unit |
| SB1, SB2, . . . | selection bit |
| SCB | selection correction bit |
| SOVA | soft output viterbi algorithm |
| XOR | exclusive "or" gate |

In the embodiments described below, a second stage SOVA detector includes a dynamic state reordering block that receives absolute state domain data from a first stage SOVA detector. The second stage SOVA detector processes the absolute state domain data to provide relative state domain data and selection bit outputs. Pipeline registers receive the relative state domain data and the selection bit outputs and provide pipelined outputs. A reliability update-register exchange unit receives the pipelined outputs and provides detected data bits and reliabilities. In a preferred embodiment, the detected data bits and the reliabilities form a signed numerical value, and the sign represents the data and the numerical value represents the reliability.

Known second stage SOVA detectors include large numbers of XORs or multiplexors. The large numbers of XORs and multiplexors use a large area of silicon and introduces significant delay. The use of embodiments of second stage SOVA detectors described below in FIGS. 3-5 reduces the area of silicon used and reduce the delay that would otherwise be present due to the large number of XORs or muliplexors in known designs.

In storage (or other communications) channels, data needs to be stored (or transmitted) reliably. In most systems two major components insure the reliability of data: the channel detector (or detector) and the error correcting code (ECC). The detector converts an analog waveform to a digital waveform, and then converts the digital waveform into ones and zeros. The ones and zeros are transmitted to the ECC where any erroneous bytes or symbols are corrected, assuming that the number of symbols that the ECC has been designed to correct has not been exceeded. Some detectors provide the benefit of generating quality information during the process of detecting the data. This quality information can be used by the ECC in the controller or by following detection stages in case of Turbo (Soft Iterative) detector to improve the reliability of the decision.

One example of such a detector is the Soft-Output Viterbi Algorithm (SOVA). "Soft-Output," "Soft-Decision," and "Log-Likelihood Ratio (LLR)" are all synonyms for "reliability data" in the context of the following description. There are two main approaches to the design of such SOVA detectors: single-stage and dual-stage. A single-stage design achieves lower latency at the cost of significantly larger area in silicon. A dual-stage design allows reduction of the area at the cost of increased latency. The performance of the second stage in a two stage SOVA detector is particularly difficult to improve.

FIG. 1 is an isometric view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation in a direction indicated by arrow 107 about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown). Data stored on disc drive 100 is encoded for writing on the disc pack 106, and then subsequently read from the disc and decoded. The encoding and decoding processes are described in more detail below in connection with an example shown in FIG. 2.

Figure 2:
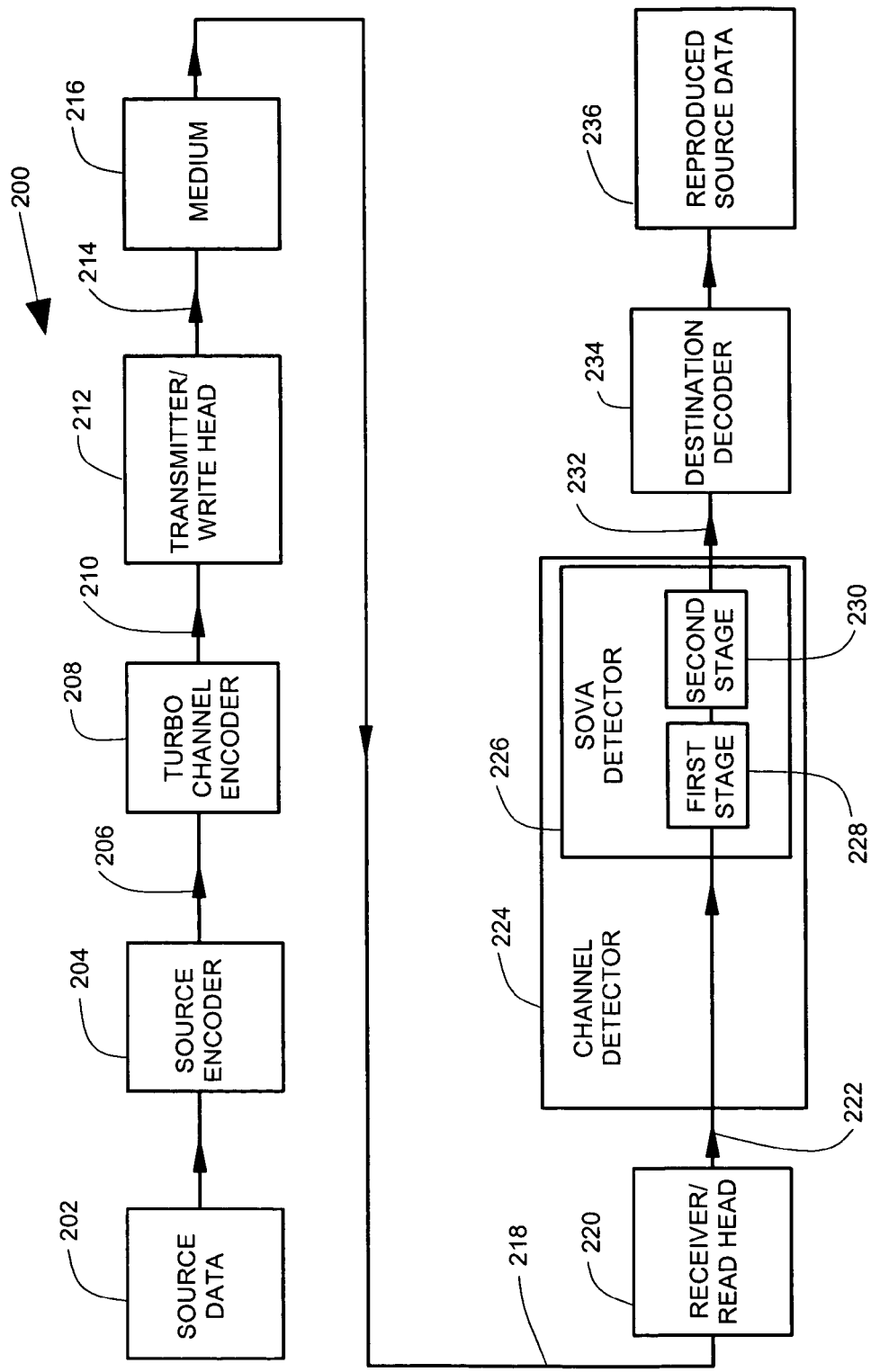
FIG. 2 illustrates a block diagram of a channel.

FIG. 2 is a block diagram illustrating the architecture of a read/write channel 200 of a storage device such as the disc drive in FIG. 1 or other communication channel in which data is encoded before transmission through a communication medium, and decoded after communication through the communication medium. In the example of the disc drive, the communication medium comprises a read/write head and a storage medium.

Source data 202, typically provided by a host computer system (not illustrated) is received by a source encoder 204. An output 206 of the source encoder 204 couples to an input of a turbo channel encoder 208. An output 210 of the turbo channel encoder 208 couples to a transducer 212. In the case of a disc drive, the transducer 212 comprises a write head. In communication channels other than a disc drive, the transducer typically comprises a transmitter. An output 214 of the transducer 212 couples to a communication medium 216. In the case of a disc drive, the communication medium 216 comprises a storage surface on a disc. In communication channels other than a disc drive, the communication medium 216 comprises other types of transmission medium such as a cable, a transmission line or free space.

The medium 216 communicates data along line 218 to a transducer 220. In the case of a disc drive, the transducer 220 comprises a read head. In the case of other communication channels, the transducer 220 typically comprises a receiver.

A channel detector 224 receives an output 222 from the transducer 220. The channel detector 224 comprises a soft output viterbi algorithm (SOVA) detector 226. The SOVA detector 226 is a two stage SOVA detector and comprises a first stage 228 and a second stage 230. An output 232 of the second stage 230 couples to a destination decoder 234. The destination decoder 234 provides an output 236 of reproduced source data that typically couples to the host computer system. The various stages of coding and decoding performed in channel 200 help to ensure that the reproduced source data is an accurate reproduction of the source data 202. Various embodiments of the second stage SOVA detector 230 are described in more detail below in connections with FIGS. 3-5.

Figure 3:
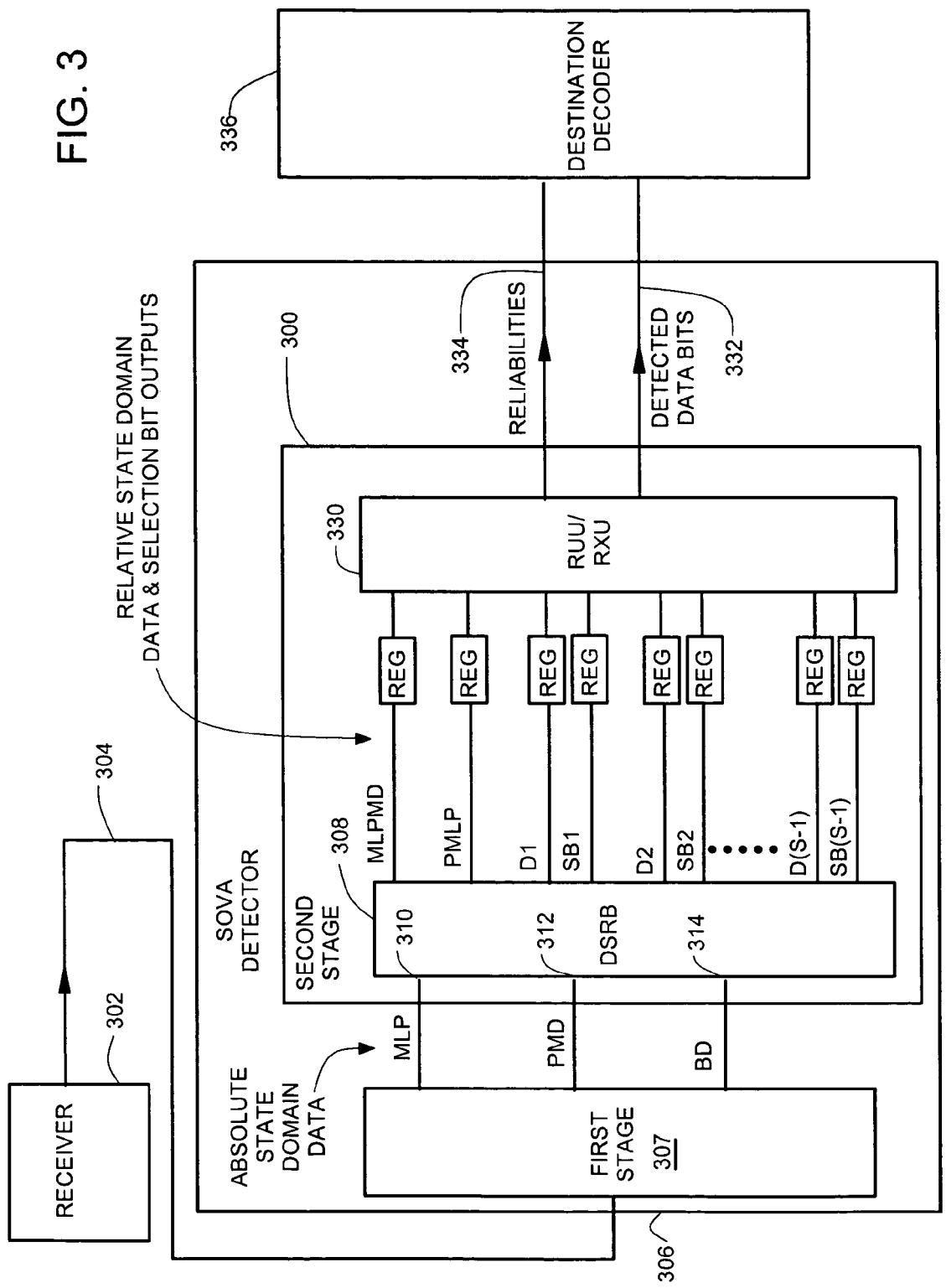
FIG. 3 illustrates a first embodiment of a second stage SOVA detector.

FIG. 3 illustrates a first embodiment of a second stage SOVA detector 300. A receiver (such as a read head) and front end read signal processing circuitry 302 provide a processed read signal 304 to a SOVA detector 306. The SOVA detector 306 comprises a first stage SOVA detector 307 and the second stage SOVA detector 300. The first stage SOVA detector 307 provides first stage SOVA detection of the processed read signal 304 and provides outputs MLP, PMD and BD that together communicate absolute state domain data to the second stage SOVA detector 300.

The second stage SOVA detector 300 comprises a dynamic state reordering block (DSRB) 308. The dynamic state reordering block 308 has inputs 310, 312, 314 that receive the absolute state domain data from the first stage 307. The DSRB 308 generates relative state domain data outputs D1, D2, . . . D(S−1) and selection bit outputs SB1, SB2, . . . SB(S−1). Outputs SB1, . . . SB(S−1) represent selection bits controlling exchange direction of the respective path registers PR (not illustrated in FIG. 3) in a reliability update-register exchange unit (RUU/RXU) 330.

The second stage SOVA detector 300 comprises multiple pipeline registers REG. Each relative state domain data output D1, D2, . . . D(S−1) couples to an input of one of the multiple pipeline registers REG. Each selection bit output SB 1, SB2, SB(S−1) couples to an input of one of the multiple pipeline registers REG. Each of the pipeline registers REG provides a pipelined output to the reliability update-register exchange unit (RUU/RXU) 330. The reliability update-register exchange unit 330 receives the pipelined outputs and provides detected data bits 332 and reliabilities 334. The detected data bits 332 and the reliabilities 334 couple to a destination decoder 336.

Output values of the SOVA detector 306 include the data bits 332 and reliabilities 334, which are typically formatted as a signed multibit number. The sign of the number represents a bit decision and the absolute value of the multibit number represents the reliability of this decision. This bit-wise soft information is called a log-likelihood ratio (LLR). The bit decisions are bits of a maximum likelihood path (MLP) generated by the Viterbi algorithm. A decision on every bit of the MLP is a result of comparison of path metrics (PMD) of the MLP and the competitor to the MLP (MLC at the current time instance). Reliabilities of these bits are generated based on the differences between the path metrics data (PMD) and bit-wise differences (MLCD) between the MLP and MLC at every time instance.

Generation of the MLP and computation of the PMD are done in a first stage SOVA detector. Since the MLP is not known in the first stage, the first stage saves PMD for each state. The second stage SOVA detector generates MLC for every bit in the MLP, selects the MLPMD—PMD corresponding to the current state of the MLP (MLPS) and completes the computation of the reliabilities by controlling a reliability update unit (RUU) with the MLPMD and MLCD. Generation of the MLC is done using the register exchange method due to the high data rate requirements.

As illustrated in more detail below in connection with FIG. 4, a register exchange unit 431 (RXU) for a trellis with S states and Path Memory of length L comprises S rows of one-bit path registers (PR), each dedicated to the particular state. Each PR has length of L and contains a current surviving path to the respective state at a current time instance. PR0 contains the path to the state 0, PR1 contains the path to the state 1, . . . , PR(S−1) contains the path to the state (S−1). The exchange of the PR's is controlled by the branch decisions (BD) saved by the first stage for every state for every time instance. The MLPS changes with time and thus the MLP can reside in any PR. The MLC always goes to the certain state (MLCS) with respect to the MLPS, but, since the MLP can occupy any row, the MLC can reside in any row too. The problem is to select the MLPMD among the PMD's generated by the first stage, select the MLP and the MLC, compute the MLCD and feed the MLPMD and the MLCD into the RUU.

One possible solution would be to use XOR gates and multiplexors for each bit of every PR in the RXU to select MLP and MLC and compute the MLCD. This possible solution has the disadvantage that it takes L*S 2-input XOR gates and L S-input multiplexors which occupy significant area on the silicon especially as L and S grow. Another disadvantage of this possible solution is that these XOR gates and multiplexors introduce additional delay in the RUU.

To overcome these disadvantages, the dynamic state reordering Block (DSRB) 308 is used. The DSRB 308 converts information in the absolute state domain that is coming from the first stage into the relative state domain. Trellis states in the first stage are mapped according to the states of the partial response shift register (Absolute State Domain). The states in the Relative State Domain are mapped relative to the current value of the MLPS which itself is in the absolute state domain (AMLPS). The algorithm of the reordering maintains the values of the MLPS and MLCS in the relative state domain (RMLPS and RMLCS) constant even though AMLPS changes. The RUU/RXU 330 following the DSRB 308 works in the relative state domain and hence the MLP and the MLC always reside in the same known PR's : PR(AMLPS) and PR(AMLCS). This allows elimination of the multiplexors selecting the MLP and MLC for the RUU along the path. The DSRB 308 also computes bit differences between the MLP and all current survivors and feeds these differences instead of the survivors themselves into the RXU. This allows elimination of any XOR gates along the path.

The fact that the MLP resides in the PR(RMLPS) all the time allows simplification of the RXU by turning the PR(RMLPS) into the simple shift register saving additional L multiplexors in the RXU.

The DSRB 308 itself contains S S-input multiplexors and 2*S 2-input XOR gates. In other words, L S-input multiplexors and L*S 2-input XOR gates in the RXU are replaced by some additional gates in the DSRB 308. The complexity of the DSRB is:

1. S S-input multiplexors and S*(log 2(S)+1) XOR gates in case of no precoder.
2. 2*S S-input multiplexors and S*(log 2(S)+2) XOR gates in case of precoder. The precoder is not counted in the additional gates because it is brought in from the first stage of the decoder.

Complexity of the DSRB 308 does not depend on the value of L. Since the value of L is usually greater than the value of S, the solution reduces the area of silicon that is used. Because the multiplexors and XOR gates are removed from timing-critical part in the design and additional gates are placed in the non-timing critical part (which can be easily pipelined) the proposed solution also improves the speed parameters of the design of the second stage of dual-stage SOVA decoder.

The DSRB circuit 308 and the RUU/RXU 330 are described in more detail below by way of examples illustrated in FIG. 4.

Figure 4:
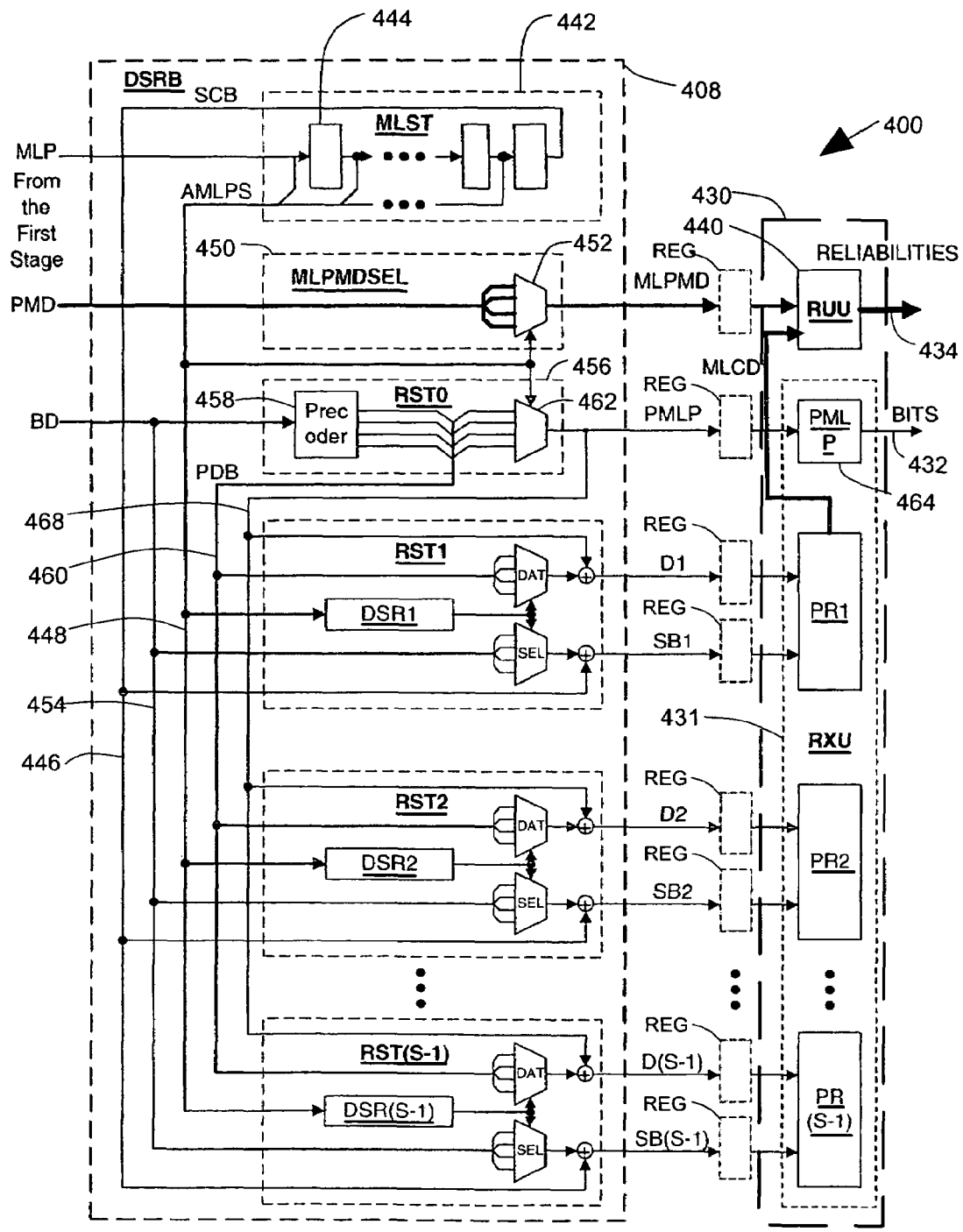
FIG. 4 illustrates a second embodiment of a second stage SOVA detector.

FIG. 4 illustrates a second stage SOVA detector 400 that is generally similar to the second stage SOVA detector 300 illustrated in FIG. 3. A first stage SOVA detector (not illustrated) communicates absolute state domain data along lines MLP, PMD, BD to the second stage SOVA detector 400.

The second stage SOVA detector 400 comprises a DSRB 408. The DSRB 408 receives the absolute state domain data from the first stage SOVA detector. The DSRB 408 provides relative state domain data outputs D1, D2, . . . D(S−1) and selection bit outputs SB1, SB2, . . . SB(S−1). The second stage SOVA detector 400 comprises multiple pipeline registers REG that couple each relative state domain data output D1, D2, . . . , D(S−1) and each selection bit output SB1, SB2, SB(S−1) to an input of one of the multiple pipeline registers REG. Each of the pipeline register REG provides a pipelined output to a path register PR1, PR, . . . , PR (S−1) in a register exchange unit 431.

The register exchange unit 431 is a part of the reliability update-register exchange unit 430. The register exchange unit 431 receives the pipelined outputs and provides detected data bits 432 to a destination decoder (not illustrated). The reliability update-register exchange unit 430 also comprises a reliability update unit 440 that receives an output MLCD from the register exchange unit 431 and that provides reliabilities output 434. In a preferred arrangement, the data bits 432 and the reliability output 434 are arranged as output word with a sign bit part representing data and a numeric part representing reliability.

The MLP line from the first stage SOVA detector couples to an MLST block 442. The MLST block 442 comprises a series of cascaded delay or shift register blocks 444. The MLST block 442 generates an output SCB. Successive outputs along the series of cascaded shift register blocks 444 together form an output bus AMLPS 448.

The PMD bus from the first stage SOVA detector couples to a MLPMDSEL block 450. The block 450 comprises a multiplexor 452 that receives the PMD bus and provides an output MLPMD that replicates a selected one of the lines in the PMD bus. The output MLPMD couples to an input of one of the pipeline registers REG, and the output of this pipeline register REG couples to an input of the RUU 440. The multiplexor 452 receives the AMLPS output 448 as a multiplexor selection input.

The BD bus 454 from the first stage SOVA detector couples to an RST0 block 456. The RST0 block comprises a precoder 458 that receives the BD bus 454 and provides a PDB bus 460. A multiplexor 462 in the RST0 block receives the PDB bus and provides an output PMLP 468 to one of the pipeline registers REG, and the output of the pipeline register REG couples to a PMLP block 464 in the register exchange unit 431.

The PDB bus 460, the AMLPS bus 448, the BD bus 454, and the PMLP line 468 and the SCB output 446 all couple to reordering blocks RST1, RST2, . . . , RST (S−1). The reordering block RST1 generates data bits D1 and selection bit output SB1. The reordering block RST2 generates data bits D2 and selection bit output SB2. The reordering block RST(S−1) generates data bits D(S−1) and selection bit output SB(S−1).

Each of the reordering blocks RST1, RST2, RST(S−1) includes a corresponding block DSR1, DSR2, DSR(S−1) that receives the AMLPS bus 448. Each of the blocks DSR1, DSR2, DSR(S−1) provides an output that is used as a select input to a data multiplexor (DAT) and a selection bit multiplexor (SEL) within each reordering block RST1, RST2, RST(S−1). Each of the blocks DSR1, DSR2, DSR (S−1) preferably comprises an exclusive or (XOR) function. This function outputs XOR value of the AMLPS and the subblock number: AMLPS XOR 1 in DSR1, AMLPS XOR 2 in DSR2, etc. Each data multiplexor (DAT) receives the PDB bus 460. Each selection bit multiplexor (SEL) receives the BD bus 454. Each reordering block RST1, RST2, RST(S−1) includes XOR gates that are indicated by a small circle with a plus sign. The output of each selection bit multiplexor (SEL) is XOR'ed to the SCB output 446 in the XOR gate to generate an output that is one of the selection bit outputs SB1, SB2, SB(S−1). The output of each data multiplexor (DAT) is XOR'ed to the PMLP output 468 in an XOR gate to generate an output that is one of the selection bit outputs D1, D2, D(S−1).

The RXU block 431 comprises the block PMLP 464, and path register blocks PR1, PR2, PR(S−1). Each of the blocks PR1, PR2, PR(S−1) receives correspondingly numbered pipelined outputs from the pipeline registers PR. The PR1 block provides the output MLCD to the RUU 440.

In the example shown in FIG. 4, the value of the RMLPS is always a "0" and the value of the RMLCS is always a "1", The DSRB comprises the following subblocks:

1. MLST—subblock generating the AMLPS based on the MLP bits coming from the first stage. This MLST subblock also generates a Selection Correction Bit (SCB) necessary for the generation of the Selection Bits SB1, SB2, . . . , SB(S−1) because of the pipelining.

2. MLPMDSEL—subblock selecting MLPMD based on the AMLPS from the PMD's coming from the first stage.

3. RST0—subblock of the Relative State 0. Because the RMLPS value is "0" this subblock is different from the subblocks of other Relative States. This subblock contains a precoder and generates precoded data bits (PDB) for other subblocks based on the BD's coming from the first stage. This block also generates a precoded maximum likelihood path (PMLP) bits for the PR0 of the RXU. Unlike other RST subblocks, the RST0 does not generate the SB signal because the PR0 is a simple shift register rather than an Exchange Register as other PR's are.

4. RST1, RST2, . . . , RST(S−1)—subblocks of the Relative States 1 . . . (S−1). These subblocks generate data bits D1, D2, . . . , D(S−1) for the PR1 . . . PR(S−1) of the RXU based on PDB and PMLP. These subblocks also generate Selection Bits SB1 . . . SB(S−1) based on the BD's and the SCB. The generation of both D and SB signals in these subblocks is controlled by the output of the Dynamic State Reordering subblocks DSR1 . . . DSR(S−1) which are unique for each of the RST subblocks. The DSR subblocks generate their output signals based on the value of AMLPS and the subblock number.

Bits of the MLP come from the first stage SOVA detector into the MLST, and MLST generates the value of the AMLPS. The MLPMDSEL selects the MLPMD value from the PMD values based on the value of the AMLPS. RST0 generates PDB values based on the BD values and selects the PMLP value from the PDB based on the AMLPS. The PMLP value is fed into the PR0 of the RXU. As described above, the PR0 (also called PMPL 464) is a simple shift register and it generates final bit values at its output. Subblocks DSR1, DSR2, . . . DSR(S−1) generate their unique mapping values based on the value of the AMLPS and drive DAT and SEL multiplexors in their respective subblocks. Outputs of the DAT multiplexors are XOR'ed with the PMLP value to generate the difference values that will be directly used in the RUU 440. These difference values are fed to the data inputs of the respective path registers (PR) in the RXU 431 through the outputs D1 . . . D(S−1) of the DSRB and pipeline registers REG. Outputs of the SEL multiplexors are XOR'ed with the SCB value to compensate for the pipelining delay. These values are fed to the select inputs of the respective PR's in the RXU through the outputs SB1 . . . SB(S−1) of the DSRB and pipeline registers.

According to the mapping rule encoded in the subblocks DSR1 . . . DSR(S−1) the value of the RMLPS is a '0' and the value of the RMLCS is a '1', and a difference is stored in the RXU. These two facts mean that the contents of the PR1 are exactly the MLCD so the PR1 is directly fed into the RUU without any additional multiplexors together with the MLPMD. The output of the RUU block represents the required reliabilities of the bit values coming out of the RXU.

Figure 5:
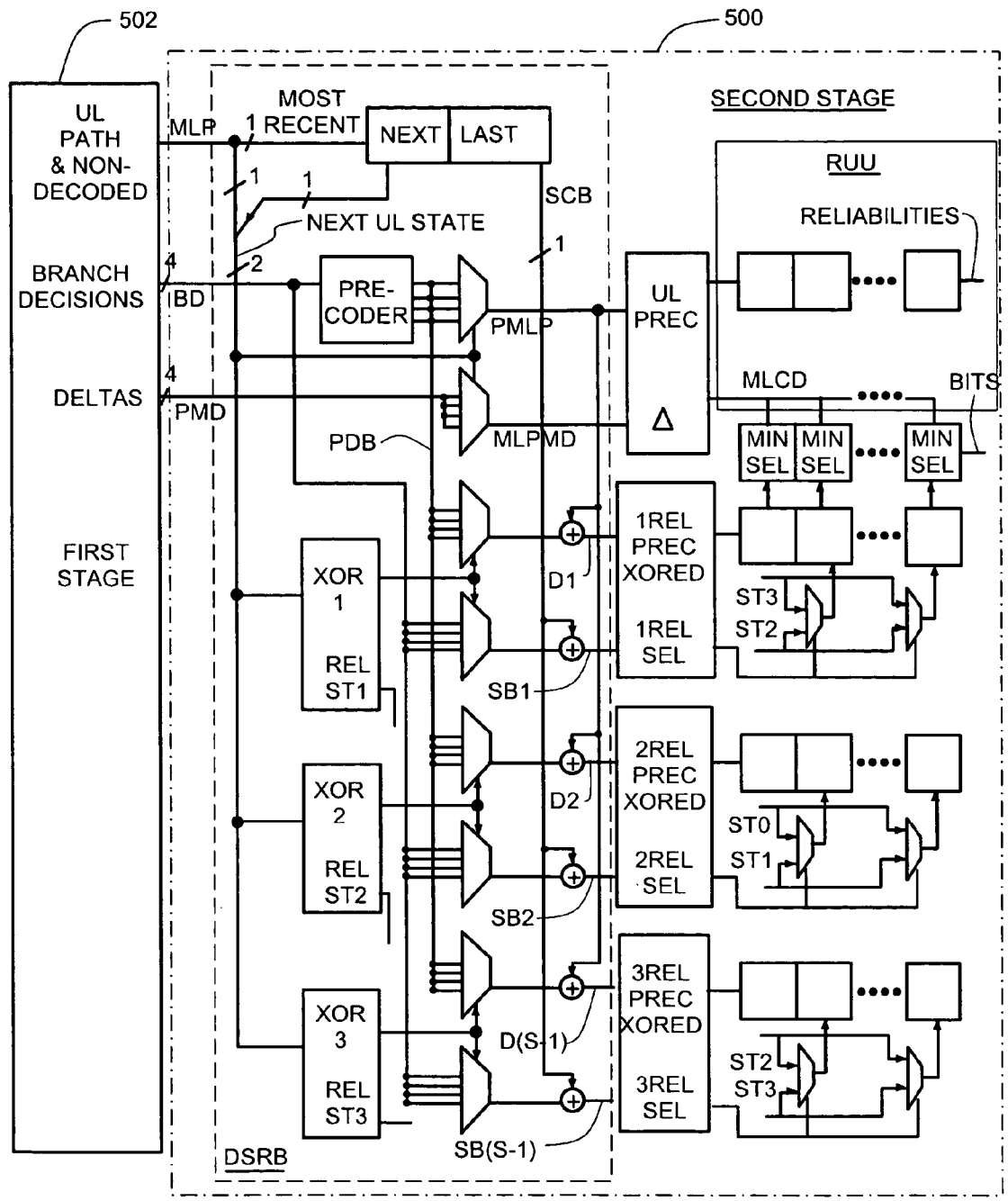
FIG. 5 illustrates a third embodiment of a second stage SOVA detector.

The circuitry in the RXU block 431 in FIG. 4 is described in more detail by way of an example illustrated in FIG. 5.

FIG. 5 illustrates a second stage SOVA detector 500. A first stage SOVA detector (502) communicates absolute state domain data along lines MLP, PMD, BD to the second stage SOVA detector 500. For brevity, Reference numbers, bus names and output names in FIG. 5 that are the same as similar features in FIGS. 3-4 identify the same or similar features in FIGS. 5.

It is understood that the approach illustrated in the examples in FIG. 3-5 can be used in other configurations, such as trellises with more than two branches entering a node (Rate×4 or RATE ½), RMLPS can have any value, and the precoder can be taken out of the second stage and put into the first stage. In circuits doing two branches in one clock cycle (Rate×4 or RATE ½), the PR(RMLCS) in the RXU will have to have two rows of registers to keep competitors for both current and previous clock cycles. The MLCD will have two bits for each bit of the PMLP. The MLPMD fed to the RUU will also have to contain the MLPMD's for the current and previous clock cycles. The selection of the limiting value inside the RUU will have to be done based on the two bits of the MLCD and on the two values of the MLPMD for each bit of the PMLP.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication channel while maintaining substantially the same functionality without departing from the scope and spirit of the present invention. In addition, although the preferred embodiment described herein is directed to a read/write channel for a data storage device, it will be appreciated by those skilled in the art that the teachings of the present invention can be applied to other communication channels, without departing from the scope and spirit of the present invention.

What is claimed is:

1. A second stage SOVA detector, comprising:
   a dynamic state reordering block that has inputs for receiving absolute state domain data and that provides relative state domain data and selection bit outputs;
   pipeline registers receiving the relative state domain data outputs and the selection bit outputs and providing pipelined outputs; and
   a reliability update-register exchange unit receiving the pipelined outputs and providing detected data bits and reliabilities.

2. The second stage SOVA detector of claim 1 wherein the detected data bits and the reliabilities form a signed numerical value, and the sign represents the data and the numerical value represents the reliability.

3. The second stage SOVA detector of claim 1 wherein the detected data bits comprise read channel data from a data storage device.

4. The second stage SOVA detector of claim 1 wherein the dynamic state reordering block maintains values of current state of maximum likelihood path and the maximum likelihood competitive path in the relative state domain data and selection bit outputs.

5. The second stage SOVA detector of claim 1 wherein the dynamic state reordering block computes a difference between the maximum likelihood path and all current survivors and provides the difference to a register exchange unit.

6. The second stage SOVA detector of claim 1 wherein the dynamic state reordering block processes S×L data blocks and comprises S S-input multiplexors and 2*S XOR gates, and the complexity of the dynamic state reordering block is independent of L.

7. The second stage SOVA detector of claim 1 wherein the dynamic state reordering block processes S×L data blocks and comprises a precoder, 2*S-input multiplexors and S*(log 2(S)+2) XOR gates, and the complexity of the dynamic state reordering block is independent of L.

8. The second stage SOVA detector of claim 1 wherein the dynamic state reordering block receives MLP and PMD from a first stage SOVA detector and the dynamic state reordering block comprises:
   a MLST that processes the MLP and generates an AMLPS; and
   a MPMDSEL that processes the PMD as a function of the AMLPS.

9. A method of second stage SOVA detecting, comprising:
   receiving absolute state domain data and performing dynamic state reordering to provide relative state domain data and selection bit outputs;
   receiving the relative state domain data outputs and the selection bit outputs at pipeline registers and providing pipelined outputs; and
   receiving the pipelined outputs at a reliability update-register exchange unit and providing detected data bits and reliabilities.

10. The method of claim 9 further comprising:
    forming a signed numerical value where the sign represents the detected data bits and the numerical value represents the reliability.

11. The method of claim 9 further comprising:
    providing the detected data bits as read channel data from a data storage device.

12. The method of claim 9 further comprising:
    maintaining values of a current state of a maximum likelihood path and the maximum likelihood competitive path in the relative state domain data and selection bit outputs.

13. The method of claim 9 further comprising:
    computing a difference between the maximum likelihood path and all current survivors and provides the difference to a register exchange unit.

14. The method of claim 9 further comprising:
    processing S×L data blocks with S S-input multiplexors and 2*S XOR gates in a dynamic state reordering block in which the complexity of the dynamic state reordering block is independent of L.

15. The method of claim 9 further comprising:
    processing S×L data blocks with a precoder, 2*S-input multiplexors and S*(log 2(S)+2) XOR gates where the complexity of the dynamic state reordering block is independent of L.

16. The method of claim 9 further comprising: receiving MLP and PMD from a first stage SOVA detector and the dynamic state reordering comprises:
    processing the MLP with a MLST that generates an AMLPS; and
    processing the PMD with a MPMDSEL as a function of the AMLPS.

17. A second stage SOVA detector, comprising:
    dynamic state reordering means for receiving absolute state domain data and for providing relative state domain data and selection bit outputs;

pipeline registers receiving the relative state domain data outputs and the selection bit outputs and providing pipelined outputs; and a reliability update-register exchange unit receiving the pipelined outputs and providing detected data bits and reliabilities.

18. The second stage SOVA detector of claim 17 wherein the detected data bits and the reliabilities form a signed numerical value, and the sign represents the data and the numerical value represents the reliability.

19. The second stage SOVA detector of claim 17 wherein the detected data bits comprise read channel data from a data storage device.

20. The second stage SOVA detector of claim 17 wherein the dynamic state reordering means maintains values of current state of maximum likelihood path and the maximum likelihood competitive path in the relative state domain data and selection bit outputs.

* * * * *